(12) United States Patent
Sandström et al.

(10) Patent No.: US 6,965,119 B2
(45) Date of Patent: Nov. 15, 2005

(54) METHOD AND APPARATUS OF CALIBRATING MULTI-POSITION SLM ELEMENTS

(75) Inventors: Torbjörn Sandström, Pixbo (SE); Jarek Luberek, Göteborg (SE)

(73) Assignee: Micronic Laser Systems AB, Taby (CH)

( * ) Notice: Subject to any disclaimer, the term of this patent is extended or adjusted under 35 U.S.C. 154(b) by 182 days.

(21) Appl. No.: 10/238,220

(22) Filed: Sep. 10, 2002

(65) Prior Publication Data

US 2003/0081303 A1 May 1, 2003

Related U.S. Application Data

(60) Provisional application No. 60/323,017, filed on Sep. 12, 2001.

(51) Int. Cl.⁷ .............................................. G01N 21/86
(52) U.S. Cl. ..................... 250/559.1; 250/216
(58) Field of Search ............................ 250/559.1, 216, 250/221; 359/292, 299, 237

(56) References Cited

U.S. PATENT DOCUMENTS

| | | |
|---|---|---|
| 4,476,465 A | 10/1984 | Anderson |
| 4,879,605 A | 11/1989 | Warkentin et al. |
| 4,908,780 A | 3/1990 | Priem et al. |
| 5,042,950 A | 8/1991 | Salmon, Jr. |
| 5,103,101 A | 4/1992 | Berglund et al. |

(Continued)

FOREIGN PATENT DOCUMENTS

| | | |
|---|---|---|
| EP | 0 344 952 A1 | 12/1989 |
| EP | 0 814 431 A2 | 12/1997 |
| EP | 0 851 387 A2 | 7/1998 |
| WO | WO 00/49577 A1 | 8/2000 |
| WO | WO 01/93303 A2 | 12/2001 |

OTHER PUBLICATIONS

Larry J. Hornbeck "From Cathode Rays to Digital Micromirrors: A History of Electronic Projection Display Technology" Digital Light Processing—Introduction TI Technical Journal Jul.–Sep. 1998 pp. 7–45.

*Primary Examiner*—Que T. Le
(74) *Attorney, Agent, or Firm*—Ernest J. Beffel, Jr.; Haynes, Beffel & Wolfeld LLP (57) ABSTRACT

The present invention relates to a method for calibrating elements in a spatial light modulator (SLM) as a function of an applied element control signal. A plurality of elements are calibrated simultaneously. A beam of electromagnetic radiation is projected onto at least a part of the SLM. An image of said part of said SLM is formed on a device for measuring intensity of electromagnetic radiation. Element calibrating data is generated by using the intensity data as a function of the applied element control signal by either driving a submatrix comprising at least two elements out of said part of the SLM to a sequence of applied element control signals or by seeking out the control signal for each element which give the same predetermined intensity value on the device for measuring the intensity of electromagnetic radiation and stepping through N different predetermined intensity values. The invention also relates to an apparatus for patterning a workpiece having such a calibration method. Other aspects of the present invention are reflected in the detailed description.

42 Claims, 7 Drawing Sheets

U.S. PATENT DOCUMENTS

| | | |
|---|---|---|
| 5,123,085 A | 6/1992 | Wells et al. |
| 5,148,157 A | 9/1992 | Florence |
| 5,278,949 A | 1/1994 | Thayer |
| 5,323,002 A | 6/1994 | Sampsell et al. |
| 5,495,279 A | 2/1996 | Sandstrom |
| 5,504,504 A | 4/1996 | Markandey et al. |
| 5,533,170 A | 7/1996 | Teitzel et al. |
| 5,594,854 A | 1/1997 | Baldwin et al. |
| 5,673,376 A | 9/1997 | Ray et al. |
| 5,684,510 A | 11/1997 | Brassell et al. |
| 5,842,088 A * | 11/1998 | Thompson .................. 399/177 |
| 5,872,902 A | 2/1999 | Kuchkuda et al. |
| 6,072,500 A | 6/2000 | Foran et al. |
| 6,169,282 B1 | 1/2001 | Maeda et al. |
| 6,188,427 B1 * | 2/2001 | Anderson et al. ........... 347/255 |
| 6,201,545 B1 | 3/2001 | Wong et al. |
| 6,261,728 B1 | 7/2001 | Lin |
| 6,285,488 B1 | 9/2001 | Sandstrom |
| 6,356,340 B1 | 3/2002 | Spence |
| 6,399,261 B1 | 6/2002 | Sandstrom |
| 6,428,940 B1 | 8/2002 | Sandstrom |
| 6,618,185 B2 | 9/2003 | Sandstrom |

\* cited by examiner

METHOD AND APPARATUS OF CALIBRATING MULTI-POSITION SLM ELEMENTS

PRIORITY CLAIM

This application claims the benefit of Provisional Application No. 60/323,017 filed 12 Sep. 2001 entitled IMPROVED METHOD AND APPARATUS USING AN SLM, invented by Torbjorn Sandström and Jarek Luberek, which is hereby incorporated by reference.

BACKGROUND OF THE INVENTION

Lithographic production is useful for integrated circuits, masks, reticles, flat panel displays, micro-mechanical or micro-optical devices and packaging devices, e.g. lead frames and MCMs. Lithographic production may involve an optical system to image a master pattern onto a workpiece from a spatial light modulator (herein, "SLM") controlled by a computer. A suitable workpiece may comprise a layer sensitive to electromagnetic radiation, for example visible or non-visible light.

Said computer controlled SLM may be a spatial light modulator (SLM) comprising a one or two dimensional array or matrix of reflective movable micro mirrors, a one or two dimensional array or matrix of transmissive LCD crystals, or other similar programmable one- or two-dimensional arrays based on gratings effects, interference effects or mechanical elements (e.g., shutters).

In general, these computer controlled SLMs may be used for the formation of images in a variety of ways. Said SLMs, include many modulating elements, in some instances, a million or more elements. For example, a problem with SLMs is that the individual elements of a given SLM most probably do not exhibit identical characteristics; e.g., they may have different reflectivity, or they may respond differently to equivalent control signals. These variations in the characteristics of the individual elements of a computer controlled SLM have limited the resolution and accuracy available for their use in optical imaging; e.g., the production of printed patterns on a workpiece has been limited as to its line width and accuracy.

Therefore, there is a need in the art for a method enabling the compensation of computer controlled SLMs, to correct for the effects caused by variations among their individual elements, in order to improve their utility in optical imaging applications

SUMMARY OF THE INVENTION

Accordingly, it is an object of the present invention to improve the accuracy of images formed using computer controlled SLMs by providing a method for determining the contributions made by the individual elements of a computer controlled SLMs to the formation of images. The accuracy of individual features of an image formed using an SLM results from the contributions made to said features by numerous individual elements of said SLM. Therefore, in order to increase the accuracy of said image features, it is necessary to control the contributions made by said individual elements to said image features. The present invention further provides a method to efficiently utilize the results derived from determining the contributions of said SLM elements, resulting in the formation of improved images.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

A state of the art SLM may have several million modulating elements (i.e., elements) arranged in a 1- or 2-dimensional array or matrix, for example a 512-by-2048 array of elements. The elements of an SLM may be movable micro mirrors, transmissive LCD elements, or may be elements of other similar devices based on gratings effects, interference effects, or may be mechanical elements such as individual shutters. Each SLM element may be set to at least 2 different states.

Figure 1:
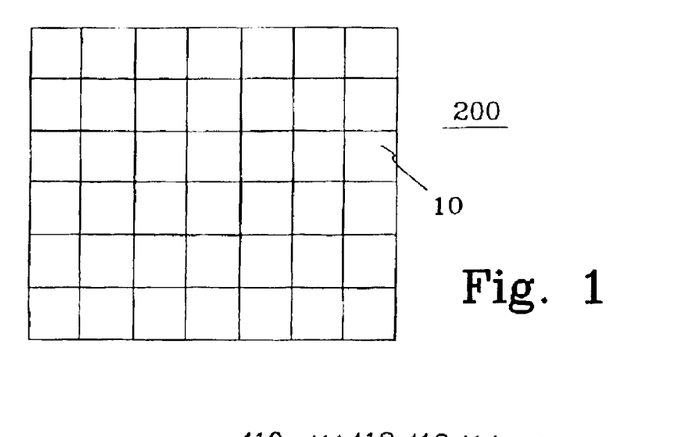
FIG. 1 schematically depicts a portion of the top view of an array of elements in a spatial light modulator (SLM).

FIG. 1 illustrates a top view of a section of an array of elements 200 in a spatial light modulator (SLM). FIG. 1 shows elements 10 having an approximately square shape. However, the elements may have any shape, such as rectangular, polygonal, circular, elliptical, etc.

Figure 2A:
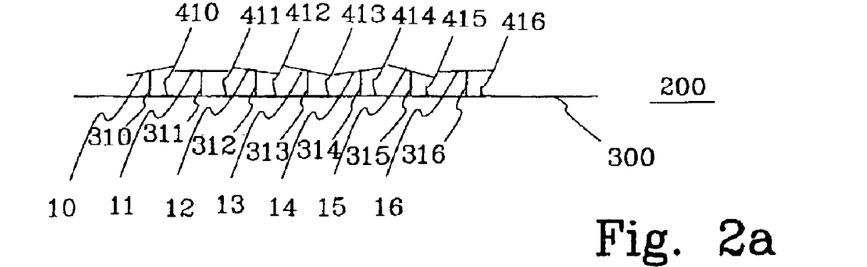
FIG. 2a illustrates a section view of SLM elements without control signals.

FIG. 2a illustrates one dimension from the array of elements 200 in the spatial light modulator (SLM) as shown in FIG. 1. In this embodiment the elements 200 comprises movable micro mirrors 10, 11, 12, 13, 14, 15, 16 said elements being arranged movably coupled to a substrate 300 comprising support members 310, 311, 312, 313, 314, 315, 316 for said movable micro mirrors 10, 11, 12, 13, 14, 15, 16 and control electrodes 410, 411, 412, 413, 414, 415, 416.

By applying a first control signal, e.g. a first voltage, on said control electrodes 410, 411, 412, 413, 414, 415, 416 and a second control signal, e.g. a second voltage, on said movable micro mirrors 10, 11, 12, 13, 14, 15, 16, said micro mirrors 10, 11, 12, 13, 14, 15, 16 may deflect around a deflection axis defined by a hinge arranged (coupled?) to the support members 310, 311, 312, 313, 314, 315, 316. The degree of deflection of each of the micromirrors will be related to the signal differential, e.g., voltage differential, between said control electrodes 410, 411, 412, 413, 414, 415, 416 and said movable micromirrors 10, 11, 12, 13, 14, 15, 16. The view shown in FIG. 2a may represent (slightly exaggerated for clarification) an electrostatically unattracted state in which no voltage is applied to the control electrodes 410, 411, 412, 413, 414, 415, 416 or the movable micromirrors 10, 11, 12, 13, 14, 15, 16.

FIG. 2a illustrates a random deflection arrangement of the movable micromirrors 10, 11, 12, 13, 14, 15, 16 due to various factors. Said deflection randomness of the movable micromirrors 10, 11, 12, 13, 14, 15, 16 may be compensated for. Moreover, the thickness of the movable micromirrors 10, 11, 12, 13, 14, 15, 16 and/or the thickness of an optional reflective coating of the micromirrors may vary from one element to another, which in turn may affect the reflectivity of the movable micromirrors 10, 11, 12, 13, 14, 15, 16. Another difference between the individual micromirrors 10, 11, 12, 13, 14, 15, 16 may be that they may respond differently to an equivalent potential difference between said movable micromirror 10, 11, 12, 13, 14, 15, 16 and said control electrode 410, 411, 412, 413, 414, 415, 416. Given the same potential difference between said movable micromirror 10, 11, 12, 13, 14, 15, 16 and said control electrode 410, 411, 412, 413, 414, 415, 416, hinges with a small cross sectional area will result in a bigger deflection compared to hinges with a bigger cross sectional area. Different surface smoothness of the micromirror may also affect the reflectivity as the distance between the substrate and the micromirror. Size differences of the elements may also affect the reflectivity.

Figure 2B:
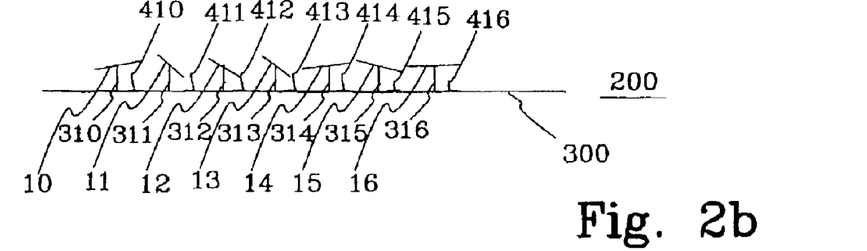
FIG. 2b illustrates the same elements as FIG. 2a, with uncalibrated control signals applied to said elements.

FIG. 2b illustrates a side view of a section of the array of elements in the spatial light modulator (SLM) as shown in FIG. 1, where some elements may be controlled with uncalibrated control signals.

Figure 2C:
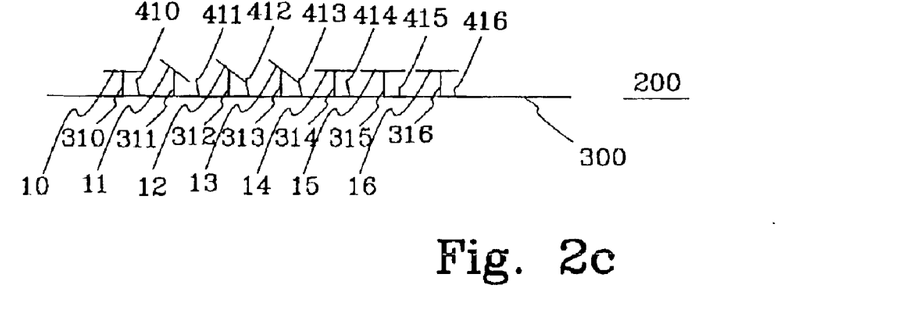
FIG. 2c illustrates the same elements as FIG. 2b, but having calibrated control signals applied to said elements.

FIG. 2c illustrates a side view of a section of the array of elements in the spatial light modulator (SLM) as shown in FIG. 2a, where some elements may be controlled with calibrated signals.

Figure 3:
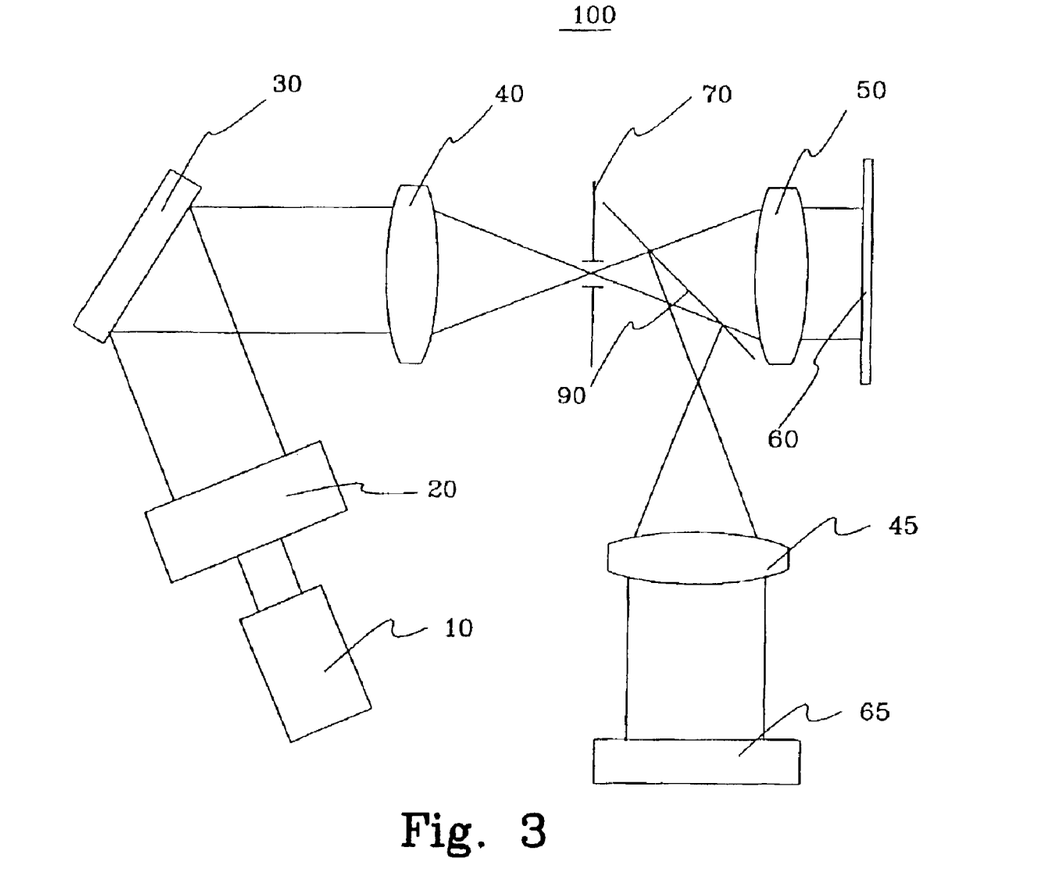
FIG. 3 is a schematic view of the principal components in an imaging system using an SLM, which may use the inventive method.

FIG. 3 illustrates an embodiment of an apparatus 100 for forming and image on workpiece 60. Said apparatus 100 comprises a source 10 for emitting electromagnetic radiation, a first lens arrangement 50, a computer controlled SLM 30, an electromagnetic radiation conditioner arrangement 20, a Spatial Filter 70 suitably located in a Fourier plane, a third lens arrangement 40, a workpiece 60, a second lens arrangement 45, an electromagnetic radiation splitter 90 and an arrangement for measuring electromagnetic radiation 65. The function of electromagnetic radiation splitter 90 could be performed by a reflective element. The formation of an SLM image onto workpiece 60 may be performed independently or simultaneously with the formation of an SLM image onto detector arrangement 65.

In FIG. 3, the source 10 may emit radiation in a pulsed or continuous manner. For a case in which radiation source 10 emits continuous radiation, said radiation may be formed into pulsed radiation by means of a shutter. Said shutter may be located in the radiation path between said radiation source 10 and said computer controlled SLM 30. In a preferred embodiment, radiation source 10 may be a KrF excimer laser emitting a pulsed output at 248 nm, a pulse duration of approximately 10 ns, and a repetition rate of approximately 1000 Hz. The repetition rate of said example radiation source may be below or above 1000 Hz.

In FIG. 3, the source 10 may emit radiation exhibiting single-mode or multi-mode properties. In another embodiment, in which radiation source 10 emits single-mode radiation, conditioner arrangement 20 may not be necessary.

Said electromagnetic radiation conditioner arrangement 20 shown in FIG. 3 may include an aperture. The size of said aperture may be changed in order to control the coherence length (i.e., spatial coherence) of the electromagnetic radiation illuminating SLM 30. Said Spatial Filter 70 shown in FIG. 3 may be changed in order to control the resolution of the optical image formed onto workpiece 60 or said arrangement for measuring electromagnetic radiation 65.

In FIG. 3, the electromagnetic radiation conditioner arrangement 20 may comprise a simple lens, an assembly of lenses, other optical components, refractive elements, or reflective elements. The electromagnetic radiation conditioner arrangement 20 distributes the radiation emitted from the radiation source 10 uniformly over at least a part of the surface of the computer controlled SLM 30. In the case of a continuous electromagnetic radiation source, said radiation from said source may be scanned over the surface of said computer controlled SLM.

For example, in FIG. 3, said conditioner arrangement 20, placed between radiation source 10 and computer controlled SLM 30, may improve the intensity uniformity of the electromagnetic radiation from source 10 illuminating the surface of the SLM. Said conditioner arrangement 20 may alter the area of the electromagnetic radiation from source 10 illuminating the surface of the SLM. Said conditioner arrangement 20 may control the spatial coherence length of the electromagnetic radiation from source 10 illuminating the surface of the SLM.

In a preferred embodiment according to FIG. 3, said radiation source 10 may be an excimer laser having an output beam of approximately rectangular cross-section. Said excimer laser output beam cross-section may have a non-uniform coherence length distribution. Said excimer laser output beam may diverge in a non-uniform manner. Said excimer laser output beam cross-section may have non-uniform intensity distribution. In said preferred embodiment, conditioner arrangement 20 may be used to control the uniformity of the intensity, coherence and phase properties of the radiation illuminating the SLM, to within a desired degree of accuracy.

In FIG. 3, said electromagnetic radiation modulated by said SLM is formed into an image on workpiece 60 by directing said radiation through third lens arrangement 40, said Spatial Filter 70 and said first lens arrangement 50.

In FIG. 3, said electromagnetic radiation modulated by said SLM is formed into an image on said radiation measurement arrangement 65 by directing said radiation through said third lens arrangement 40, said Spatial Filter 70 and said second lens arrangement 45.

In FIG. 3, the placement of electromagnetic radiation splitter 90 in relation to said lens arrangements 40, 45, 50 and said Spatial Filter 70 is arbitrary, and various suitable combinations could be found, including one that does not require said splitter.

In FIG. 3, said electromagnetic radiation measurement arrangement may comprise a Charged Coupled Device (CCD) camera, a MOS-camera, or a Charged Injection Device (CID).

A method according to the invention for calibration of the elements of an SLM begins with an SLM as shown in FIG. 2a, said SLM having elements whose contributions to image formation need to be determined.

Optionally, the method may include calibration of the dose measurement characteristics of the elements of said electromagnetic measurement arrangement. For example, said measurement arrangement may comprise a CCD camera capable of measuring a specified working range of electromagnetic radiation doses. In this example, it is preferable that the electromagnetic radiation dose measured by the CCD camera be around 80% of camera's maximum input range. When the electromagnetic radiation dose projected onto the CCD camera is too low, the signal to noise ratio will in some cases be unacceptably low. When the electromagnetic radiation dose projected onto the CCD camera is too high, the CCD camera may become saturated. In either case, this may result in an inaccurate measurement. Calibration of the electromagnetic measurement arrangement is performed using a uniform light source in order to determine the relative sensitivities existing among the detector's elements.

Calibration of the elements of an SLM begins with determining the dose of electromagnetic radiation required to establish an approximately 80% level on a portion of the elements of said radiation measurement arrangement by the radiation projected from a portion of an SLM having uncontrolled elements (i.e., with no control signals applied). We may adjust the electromagnetic radiation source in order to establish said approximately 80% dose measurement. Said dose measurement is a computed average of the doses measured by all the illuminated elements of the measurement arrangement. For example, to adjust a pulsed electromagnetic radiation source, we may increase or decrease the number of pulses applied, and we may adjust the dose of each pulse. Likewise, to adjust a continuous electromagnetic radiation source, we may insert an attenuator in a radiation path between the radiation source and the CCD. It is also possible to change the dose by changing the output power of the laser or by inserting a variable attenuator in the output path of the laser. The measurement of said average doses is repeated until the dose contributions from all the elements of the SLM have been obtained and included in said average.

Repetition of this averaging process is performed while driving the control signals for each element through a succession of values from the range of permissible values. For a given control signal value, the dose contribution of all elements is measured in the above manner and the average dose is calculated.

The average dose values thus obtained comprise an average transfer function of the contributions made by the SLM having uniform control signals.

Next, the elements of the SLM are mapped in relation to the elements of the CCD. The object of this is to establish a known relationship between the elements of the SLM and the elements of the CCD camera. For example, a readily identifiable pattern may be formed on the elements of said radiation measurement arrangement by selectively driving certain elements of the SLM with a first control signal value selected from said average transfer function, while driving all other elements of the SLM with a second control signal value selected from said average transfer function. Said first and second control signal values are selected to obtain a desired difference between measured doses, thus setting a contrast for the identification of said pattern.

One or more patterns, applied in the fashion described above, can be used to establish the relationship between elements of the SLM and elements of the measurement arrangement (e.g., a CCD). For example, in the preferred embodiment, the image formed onto said arrangement may be corrected for translation deviations, scale errors, mirror effects and rotational errors between said SLM and said CCD according to the formula y=MSR(x−t), where y is the CCD coordinate, M=mirroring, S=scale factor, R=rotation, x=SLM coordinate and t=translation. Y is a vector containing coordinates for the CCD element. M may for instance be the 2×2 unity matrix or mirroring matrix. S may be any figure in the range from 1 to infinity, but preferably between 2 and 3. R may be a 2×2 matrix with cos(a) in the upper left position, −sin(a) in the upper right position, sin(a) in the lower left position and cos(a) in the lower right position, where a is typically a few milliradians.

Having determined a map of the relationship between the elements of the SLM and the elements of the radiation measurement arrangement, we may proceed with the determination of the transfer functions for elements of the SLM describing their dose contributions as a function of their control signals. Specifically, for a desired average dose value of the SLM array, we may proceed to establish the individual control signal values provided to each SLM element causing the dose contributed by each SLM element to be equal within a desired degree of accuracy. Thus, for said desired average dose value, there exists a unique set of control signal values for the elements of the SLM, such that said set of control signals can be used to obtain a desired uniform dose distribution. The elements of the SLM, in this calibration procedure, are effectively individuated.

A plurality of said sets of control signals establishes the dose transfer functions for the elements of said SLM.

It is desirable to determine the control signal value required to obtain a given dose from a given SLM element in an efficient manner. The derivative of the calibration curve in order to reduce the number of steps to find the right control signal for each element. As the number of known points on the calibration curve increases the steps to find the right control signal for a specific intensity value decreases since the information about the calibration curves are enhanced by said known points.

In a preferred embodiment of this invention, the single elements in the SLM are not resolved in the CCD camera.

Secondly, a finer grid of the cluster of elements in said SLM is measured on the CCD. At this stage, with a finer grid, the number of elements at each element cluster in the SLM may be a 3 by 3 array with for example 20 elements in between each cluster.

Thereafter, a further refinement of the cluster of elements in the SLM is measured on the CCD, for example with a single element in the cluster with 10 elements in between.

As a further refinement of the mapping of SLM to the CCD a non linear correction may be added. This means that y=MSR(x−t)+nonlinear correction. This non linear correction is for example computed by assigning second order polynomial expressions with unknown coefficients a-j. Such a polynomial expression may be:

$$nc\_1 = ax(1) + bx(2) + cx(1)^2 + dx(2)^2 + ex(1)x(2)$$

$$nc\_2 = fx(1) + gx(2) + hx(1)^2 + ix(2)^2 + jx(1)x(2)$$

where nc_1 is the nonlinear correction for coordinate x and nc_2 is the nonlinear correction for coordinate y. If the correction varies with (x,y), as in this case, a position dependent non linear correction U can be fitted to the function (nc_1, nc_2)(x(1), x(2)) by using the least square fit method.

The CCD-camera is for example a camera from Kodak® KAF 1600 with approximately 1000*1600 elements and sensitivity for the wavelength used, e.g. 248 nm or 197 nm. Typically this involves converting the radiation to visible light by a fluorescent dye, but camera chips which are directly sensitive to short wavelength, e.g. 248 nm are also available.

Figure 4A:
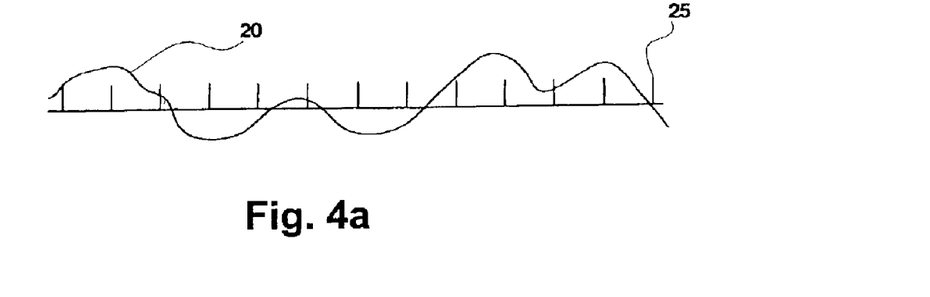
FIG. 4a depicts a dose density profile 20 formed onto the elements of an arrangement for measuring electromagnetic radiation by an SLM having elements driven by identical control signals.

In the next step of this embodiment, the SLM element control signal giving rise to a predetermined intensity value on the CCD camera elements is found. Having established where a given SLM element will be detected by the CCD camera, said image measured by the CCD camera can be methodically utilized in order to arrive at said predetermined values for all SLM elements. FIG. 4a illustrates the response of the CCD camera to a typical projected electromagnetic radiation from an uncalibrated SLM. Vertical lines 25 represent the boundaries between adjacent dose measurement elements. FIG. 4a illustrates some elements having a greater dose transfer ratio and some elements having a lesser dose transfer ratio than desired. Using the mapping between individual elements of the SLM and one or more elements of the CCD camera, we can alter the state of the SLM mirrors/elements to obtain a uniform dose transfer ratio.

An iterative method is followed to successively change the state of the SLM mirrors/elements in order to obtain measurements of the images thus projected onto the CCD camera. These sequential changes to the state of the elements are made in steps smaller than the difference between the predetermined (i.e., desired) value and the factual (i.e., measured) value. This procedure is followed to ensure a convergent method. The elements are calibrated by successively repeating the iterative procedure in which the state of the SLM elements is changed and the projected SLM image is measured using the CCD camera. The calibration of the SLM elements can be determined to be complete for an arbitrary predetermined intensity value, as measured by the CCD camera. For example, an arbitrary level of uniformity can be established by calibrating using the measured dose transfer ratios of the SLM elements until a standard deviation of 0.5% is reached for the dose values measured by the CCD camera.

The procedure described above is repeated for a predetermined sequence of different dose transfer ratios, thus determining the dose transfer ratio as a function of control signal value (e.g., voltage) for each SLM element.

For example, the method described above can be used to determine the maximum and minimum transfer ratio values of the SLM elements. Thus, common maximum and minimum bounds of the SLM elements can be established. Having determined the functions establishing transfer ratio as a function of control signal for the SLM elements, and having established common maximum and minimum bounds for said functions, we can then find inverse functions for each of the elements defining their control signals as a function of transfer ratio. Thus, the SLM elements can be individually controlled to provide a desired transfer ratio within the common bounds.

Approximate expressions can be derived, defining the transfer function of each element in response to its control signal, to a desired degree of accuracy.

Figure 4B:
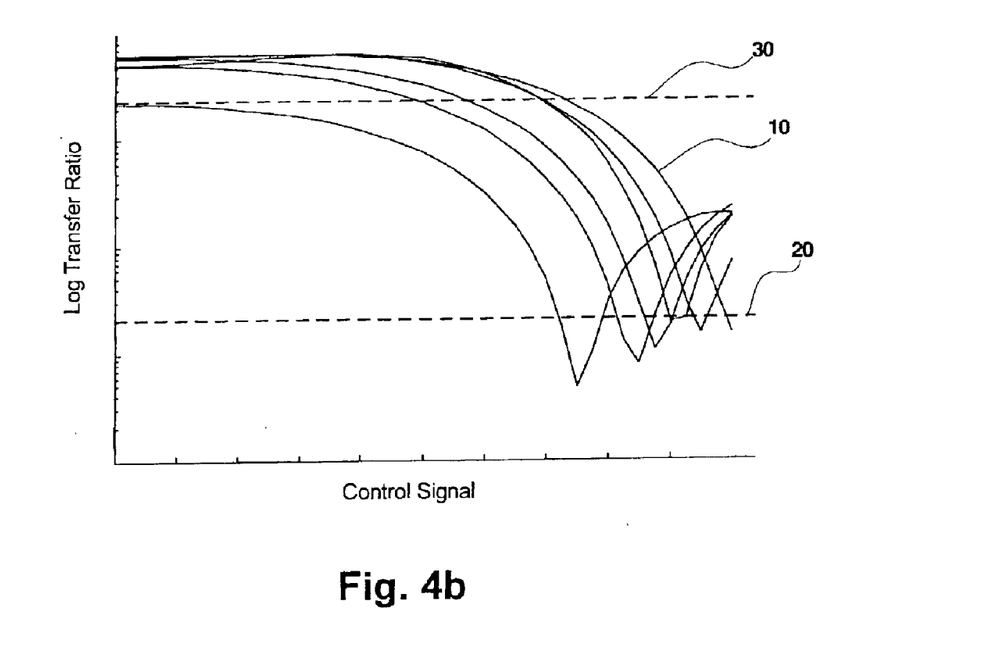
FIG. 4b illustrates the transfer functions for a plurality of SLM elements as a function of the control signals applied to said elements.

FIG. 4b shows a plurality of SLM element transfer functions as a function of control signals. It is desirable that each of the SLM elements be capable of providing dose contributions within a common range defining the bounds for a relative maximum dose level (i.e., "white") and relative minimum dose level (i.e., "black"). Thus, the dynamic response range required of each element in the entire array will be limited to the levels attainable by the other elements of the array as indicated by lines A and B in FIG. 4b. For the case in which certain elements cannot operate within a given common dynamic response range, we may have to exclude the use of said elements as being defective. Some or all of said defective elements might still be utilized by compensating for their errors in "black" or "white" levels.

Having established a common range of "white" and "black" levels for an SLM, we may perform a calibration of the elements in the SLM array to establish their individual control signal vs. transfer ratio functions; namely, we may establish their control signals as functions depending on their dose responses. This will enable us to control element dose contributions within desired limits of accuracy. Various methods can be utilized to effect the calibration of the elements in an SLM array in this fashion; e.g., a lookup table of values can be obtained for each SLM element, or an expression approximating the response function for each SLM element can be obtained.

Varying amounts of storage capacity may be required to preserve the response functions obtained. The amount of storage capacity required may depend on the arbitrary limits of accuracy selected, and might also depend on the manner in which the function itself is represented.

It is preferable to minimize the storage capacity required to preserve the calibration obtained for the SLM elements. These calibration results may comprise the common range values for the SLM, the individual calibration functions of the SLM elements, and the values of other parameters required to obtain improved optical images. Various techniques may be employed to reduce the storage capacity required for the calibration results, while preserving the ability to make effective use of said results.

FIG. 4b depicts an example of a plurality of measured SLM element responses as a function of the control signals applied to said elements. In this figure the horizontal lines A and B represent the dynamic range representing dose levels attainable by all elements.

Figure 8:
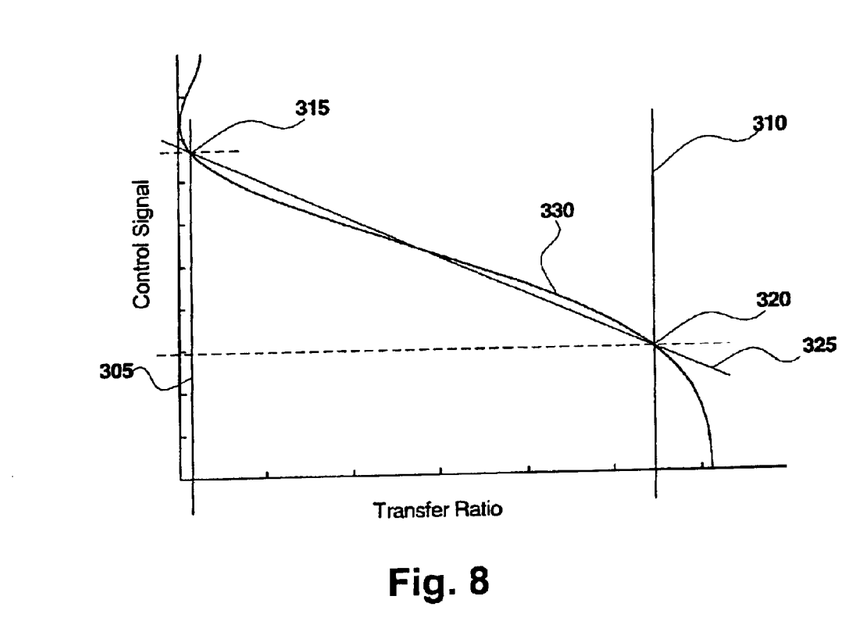
FIG. 8 Illustrates a possible inverse function of the relationship between the control signal applied to an element and the detected dose.

One way of finding an expression useful for defining the control signals as a function of element responses is interpolation using Fourier methods. For instance, each element is calibrated using four parameters. FIG. 8 illustrates control signal as a function of transfer ratio. In FIG. 8, the common "black" level 305 and the common "white" level 310 are indicated with vertical lines. The first two interpolation parameters are defined by the control signal and transfer ratio values represented by intersections 315 and 320, formed by the element response 330 and the "black" and "white" levels 305 and 310. Said intersections 315 and 320 define a first order function 325. Additional calibration parameters may be obtained by calculating Fourier coefficients reducing the difference between response function 330 and linear function 325.

By construction function 325 has zero difference from function 330 at intersections 315 and 320. Thus, it is sufficient to use $\sin(\pi x)$ and $\sin(2\pi x)$ as the harmonic terms of a Fourier expansion which significantly reduces the difference between function 330 and function 325.

Thus, four parameters represent a calibration function. Two calibration parameters describe function 325, and two calibration parameters serve as coefficients for the base functions $\sin(\pi x)$ and $\sin(2\pi x)$. An example of this type of calibration expression would be $z=a+bx+c(\sin(\pi x))+d(\sin(2\pi x))$, where a, b, c and d may be unique for each element of an SLM, while $\sin(\pi x)$ and $\sin(2\pi x)$ may be common to all elements. Calibration results represented in this manner can be economically stored.

In FIG. 8, the use of Fourier methods is not limited to the four parameters mentioned above. Any combination of Fourier components might be used to reduce the difference between function 325 and function 330.

An SLM having M elements may have M calibration functions. Expansion of each calibration function into N components produces matrix A having dimension N-by-M. Base functions may be obtained by selecting the two Eigenvectors having the largest Eigenvalues from square matrix $AA^t$, where t symbolizes transposition. Using the eigenvectors of said square matrix we can form base functions using $$f_n(x) = \sum_i c_{n,i} \sin(i\pi x)$$

where $c_{n,1}$ is the $i^{th}$ element of eigenvector n.

The base functions obtained in this way may fit the data without average or systematic errors. Furthermore, said base functions are sine-like although the choice of Fourier base is insignificant.

Fourier methods and least square fits are among the available calibration procedures for the equations above. By the Fourier method, one finds the coefficients by integrating, $$c = \int_0^1 \sin(\pi x) e(x) dx = \sum_{n=1}^N w_n e(b_n) \sin(2\pi b_n) \sqrt{1-b_n}$$

where e(x) is the difference between the straight line that interpolates the data at the end points, $w_n$ and $b_n$ are weights and abscissas from the quadrature. One also integrates similarly for $\sin(2\pi x)$, This integral is easily solved by a Gauss-Chebyshev quadrature. A quadrature with as few as four points in the interval can produce satisfactory results.

The calibration coefficients (e.g., a, b, c and d) are found by solving Ac=Y, where A is a 4×4 matrix and Y is a 4×1 vector. In this example, the matrix has elements $$A_{ij} = \sum_m w(x_m) f_i(x_m) f_j(x_m) \quad \text{and} \quad Y_i = \sum_m w(x_m) y_m f_i(x_m)$$

where $Y_i$ is the control signal at a normalized transfer ratio value $x_m$ and $w(x_m)$ are the weight functions which can be chosen to unity. The two functions $f_1$ and $f_2$ are the constant function and the linear function $f(x)=x$. The remaining two that were used, are those derived from a sin c(x)-function. Calibration coefficients minimizing variance may be obtained by setting weight function w(x) to unity.

Yet another example of two base functions is the use of $\sin(\pi x)$ and $\sin(2\pi x)$, thus obtaining a solution similar to a Fourier expansion. The difference between this example of base functions and the preceding example is the requirement that. In the first case, the Fourier interpolation method, two constants having an exact fit at intersections 315 and 320, and linear function 325, are used to interpolate calibration data. In the second case, they are chosen freely by the least square algorithm. Consequently, the least square fit produces the smallest average error, but will not necessarily provide an exact fit at the intersections.

The formula for compensation is $$U(x) = c_1 + c_2 x + c_3 f_3(x) + c_4 f_4(x)$$

There are four (4) unique coefficients for each element and two supporting functions ($f_3(x)$ and $f_4(x)$) common to all elements. These two functions can be put into tables as a result of the calibration procedure. The parameter, x, was in this case normalized to range (0.1), though other normalizations can be used in the final implementation.

It is useful to minimize the storage and bandwidth required for element compensation coefficients, e.g. to 32 bits per element. This will introduce "round-off" errors in the compensation. For example, consider coefficients rounded to 9, 9, 7 and 7 bits respectively. The round-off is done with each set of numbers first transformed into the range 0 . . . 1 by $$X' = \frac{x - \min(x)}{\max(x) - \min(x)}, \quad \begin{array}{l}(X' \text{ the belongs to the (closed)}\\ \text{range } [0 \ldots 1]\end{array}$$

and then truncated to N bit precision by $$x_b = \text{Round}(X' 2^N)/2^N (\max(x) - \min(x)) + \min(x)$$

The function "ROUND" simply rounds towards the nearest integer. "½^N" shifts the result back to the [0 . . . 1] range and the last multiplication restores the original calibration parameters that are now in N-bit precision. The remaining calculations are done in floating point (64 bit, IEEE) precision. For the methods presented here, storing 9,9,7,7 (7 bits for the constants that multiply the tabled functions) bits for compensation components is not always the optimal choice. If the base function is changed, then another storage may become optimal. Simulations indicate though that choosing the storage in this ways will produce sufficiently accurate results.

In 32 bits storage, it may be necessary also to store a 7 bit area code. Tests show that the storage of coefficients with 7, 7, 5, 6 bit precision, respectively, makes room for the area code, still fitting in 32 bits storage per element.

More than one set of coefficients may be stored for each element, to take into account aging of elements, time between element rest periods, number of element cycles between element rest periods, or other characteristics of the individual elements that change over time.

Alternative scalings of coefficients affect the computation required, e.g., in FIG. 27. The recovery of the coefficients from stored values by multiplying with the range (maxvalue-minvalue) may turn out to be computationally too expensive. If the range is replaced by the nearest multiple of 2 that exceeds the range, coefficients can be recovered by a simple shift operation, with some sacrifice of accuracy. The two alternative ways of recovering coefficient the are: 1) As before, multiplying the scaled value to recover the range from maximal value to minimal value; and 2) As above, but exclude the smallest and the largest values for individual elements. (Variations on this approach include excluding just the smallest or just the largest value, or excluding a plurality of smallest or largest values for individual elements.) Excluding outlying values has the effect that two of the values may not fall within the range 0 . . . 1–$2^{-n}$. If that is the case, the excluded values are stored as 0 and $2^{-n}$ respectively. The second procedure may introduce substantial errors to the compensation error of the excluded elements (e.g., in two out of 1000 elements), while potentially, having the possibility to store the remaining coefficients more efficiently. The table below represents simulated errors of various methods. The first alternative scaling method is called "all" and the second "loose2".

| Method | No round-off | Optimal | All | Loose2 |
|---|---|---|---|---|
| Standard dev. | 0.13% | 0.23% | 0.32% | 0.25% |

As the table shows, "loose2" is almost as accurate as a "optimal" on average but some elements have compensation errors as large as 5% while "all" keeps the compensation error for all elements below 1.5% at the expense of the average error.

Different scaling methods can be selected for the coefficients $c_1 \ldots c_4$, depending on their distributions. For instance, in simulations, most of the time $c_1$ is normally distributed, so excluding 0.2% of the most extreme calibration coefficients may not change the range much. In the same simulation, $c_4$ has a few extreme values and excluding those does seem to improve the storage efficiency for the remaining values.

Figure 7:
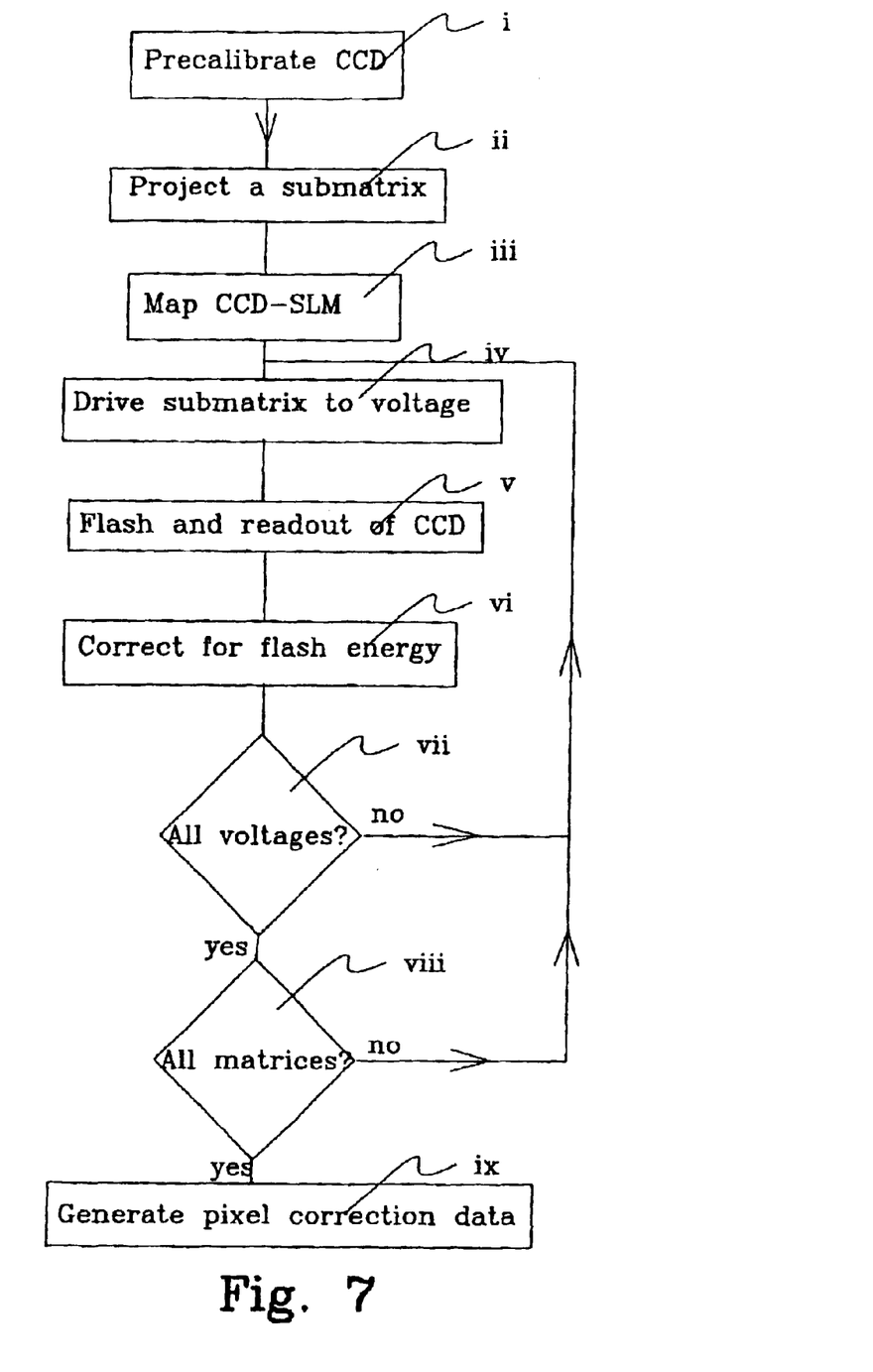
FIG. 7 is a flowchart of an embodiment according to the invention.

FIG. 7 illustrates one exemplary embodiment of the invention, in which electromagnetic radiation is projected onto at least a part of the SLM. For example, the radiation source may be a continuous or pulsed laser. Said calibration is performed on the part of the SLM on which said electromagnetic radiation is projected. Electromagnetic radiation may be projected onto any part of the SLM area; for instance, this may be one tenth, one half or any other portion, including the complete area of the SLM.

Next an image on an detector arrangement is formed from said part of the SLM. For example, said detector arrangement may be a CCD-camera, a MOS-camera, or a Charge Injection Device. In said formed image, regions having varying amounts of intensity may appear due to the different states and characteristics of the elements in the SLM; for instance, their respective deflections and reflectivities may vary. The image of the SLM formed onto the detector corresponds to the image on the workpiece 60.

Thereafter, the state of at least two elements in said part of the SLM are varied by a sequence of applied control signals while measuring the intensity from said individual elements on said detector arrangement. For instance, said at least two elements may be a sub-matrix, where elements in the sub-matrix may be separated by elements in a non-addressed state, i.e. separated by elements having no applied control signal.

In this manner, the calibration functions for all the elements in said part of the SLM are computed using the measurements made of intensity values as a function of applied element control values. The above procedure is repeated for all areas of the SLM until all elements of the SLM have been calibrated.

Optionally, said detector arrangement (e.g., the CCD camera) may be calibrated prior to its use for SLM element calibrations. Said prior calibration of the detector arrangement may be performed by projecting electromagnetic radiation of known characteristics (e.g., having approximately the desired wavelength) onto said detector. Said prior calibration electromagnetic radiation source may comprise a discharge lamp and an interference filter, selected to provide a narrow wavelength range having approximately the wavelength of the electromagnetic source used for formation of the SLM image. Said prior calibration comprises measuring the intensity detected by each element in the detector arrangement, in response to the projection of said prior calibration source. Said prior calibration of the detector arrangement permits compensation of the intensity values measured by the elements of the detector arrangement; i.e., after said prior calibration, the accuracy of the measured intensities will be enhanced.

The sub-matrix comprising at least two elements may be chosen to achieve simultaneous element calibrations, thus avoiding having to sequentially calibrate each individual element of said SLM. The SLM elements to be calibrated are not located next to each other but are chosen to have a separation such that their respective images on the detector arrangement can be concurrently measured with an arbitrary degree of accuracy. For example, said at least two elements in said sub-matrix may be separated from each other by 5 elements in each direction, but other amounts of separation may also be used. Said arbitrary degree of accuracy for the measured radiation intensity for the elements in said sub-matrix may be established to achieve a desired image formation quality.

Figure 5:
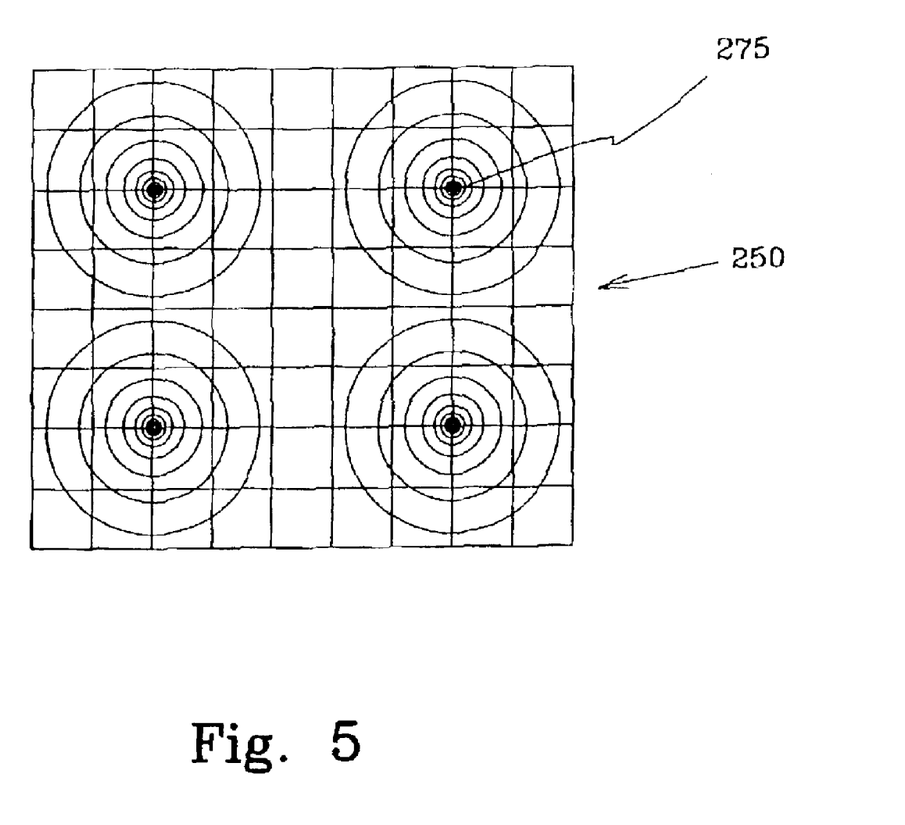
FIG. 5 shows schematically a dose distribution formed on a portion of the elements of a detector arrangement by a plurality of SLM elements.

FIG. 5 shows schematically a top view of the energy distribution 275 projected onto the elements in an detector arrangement 250 by individual elements of an SLM. Said energy projected onto the detector arrangement elements may have the form of a Gaussian distribution. In FIG. 5, said Gaussian distribution are schematically represented by circles, where very close circles, as in the center of each Gaussian distribution, represent higher energy, and more widely separated circles represent lower energy. FIG. 5 shows that the Gaussian distribution separations on the detector arrangement 250 along the horizontal axis are wider compared to the separations of the same distributions along the vertical axis. In FIG. 5 the distance between the center of the Gaussian distributions in the horizontal direction is 5 detector arrangement elements, while in the vertical direction the distance between the same Gaussian distributions is 4 detector arrangement elements.

Optionally, the elements in the SLM is mapped with the elements in the CCD camera to establish a known relation between the elements in the SLM and the elements in said CCD-camera. In this mapping step the center of the intensity of the radiation from the elements in the SLM can be aligned essentially in the center of the elements in the CCD camera. Alignment errors of the order of 0.5 elements cause the calibration algorithm to create spurious patterns in the image. This may be performed by measuring a center of the spot on the CCD and the position of the SLM image on the CCD is adjusted by a translation, magnification and/or rotation to fit the elements on the CCD as described above in connection with the previous embodiment.

Alternatively the position of the spots on the CCD is measured and a region is computed for each element, so that a computer can assign the image at a particular location on the CCD to a corresponding SLM element.

Alternatively first a coarse grid of very few elements in said SLM is measured on said CCD camera, for example a number of elements, e.g. a cluster of 5 times 5 elements may be chosen to begin with so a distinctive signal is given on the CCD. Said cluster of 5 times 5 elements may be moved from one corner to another in the rectangular SLM area. The elements in the cluster are set to a value, which is distinctive from the nearby unaddressed elements.

The image on the CCD at this stage may correct for translation deviations between sad SLM and said CCD, i.e. scale errors, rotational errors etc. In the preferred embodiment of this invention the single elements in the SLM are not resolved in the CCD camera.

Secondly a finer grid of the cluster of elements in said SLM is measured on the CCD in order to locate which elements in the SLM will create intensity values on the CCD and where. At this stage with a finer grid the number of elements at each element cluster in the SLM is reduced to 3 times 3 elements with for example 10 elements in between each cluster.

Thereafter a further refinement of the grid of cluster of elements in the SLM is measured on the CCD, this time for example with single elements in the SLM with 5 elements in between such.

As a further improvement, a correction for the spot position relative to a CCD element grid may be applied to remove or reduce Moiré effects due to insensitive area between the CCD elements or similar effects. The magnification in the projection system may or may not be adjusted, so that the image of the sub-matrix is adjusted with the element pattern on the CCD, e.g. the CCD may have one element per two elements in the SLM or another rational relation. The CCD elements typically have a capacity of 100,000 electrons. In the measurement region formed by several elements the capacity may be larger by a numerical factor representing the number of elements, e.g. 4 or 16 as shown in FIG. 5. The typical number of electrons in a region is 200,000 and the number has a statistical distribution (Poisson distribution). To average this random effect as well as other randomness every measurement is repeated N times. At the same time Moiré effects can be averaged if the image is moved over the CCD-camera during the N measurements.

The CCD-camera is for example a camera from Kodak® KAF 1600 with approximately 1000*1600 elements and sensitivity for the wavelength used, e.g. 248 nm or 197 nm. Typically this involves converting the radiation to visible light by a fluorescent dye, but camera chips which are directly sensitive to short wavelength, e.g. 248 nm are also available.

In order to calibrate all elements in the illuminated part of the SLM said at least two elements at a time are changed and driven to a sequence of applied element control signals. Now we have a knowledge about the dose on the CCD as a function of control signal for each element. With the knowledge of dose as a function of applied voltage for every element a state is computed representing average zero intensity of electromagnetic radiation onto the detector arrangement out of the measured intensity data.

Thereafter at least the most adjacent elements to the elements in said sub-matrix are arranged in said computed state.

As can be seen from FIG. 2a, the elements 10, 11, 12, 13, 14, 15, 16 in an electrostatically unattracted state may be in a random state of deflection and therefore may contribute to the radiation intensity at a specific CCD-camera element and thereby decrease the accuracy of the measured intensity. In order to eliminate or at least reduce an inaccuracy in the measured intensity coming from a specific SLM element, at least the closest SLM elements to said at least two elements in said part of the SLM are arranged in said computed state.

Not only the most adjacent elements to said at least two elements in said SLM may be set to said computed state, preferably all elements other than said at least two elements in said SLM are set to said computed state.

Thereafter at least two elements at a time in said SLM are driven again to a sequence of applied element control signals while measuring the intensity of the electromagnetic radiation, while at least the most adjacent elements to said at least two elements in the SLM are set to said computed state. After having completed the calibration of all elements in said part of the SLM a second time, a new state is computed for each element corresponding to average zero intensity of electromagnetic radiation onto the detector arrangement out of the second measured intensity data. This procedure is repeated until for example the standard deviation of the measured intensities are below 0.5%

The intensity of the elements in said sub-matrix is measured in said CCD camera. The CCD camera does not have to resolve single elements, because only one sub-matrix is changed at a time. The change of a single element can be inferred from the measurement. The density of the sub-matrix may be chosen to make the spots on the CCD essentially non overlapping. The CCD may or may not have the same number of elements as the SLM. The light in the CCD-camera image within a certain area is assumed to come from one element in the SLM, provided that the surrounding SLM elements do not change.

Optionally a compensation for energy variations in different electromagnetic radiation pulses is performed. The calibration of the elements may be performed by illuminating said sub-matrix of elements in said SLM by a pulsed laser and measuring and calculating an intensity from one or a plurality of laser pulses and correcting the measured CCD data for the measured pulse energy.

Said projecting of electromagnetic radiation from said sub-matrix of elements onto a device for measuring intensity of electromagnetic radiating may be performed after Fourier filtering of said electromagnetic radiation. In FIG. 3 a beam splitter 90 is arranged between the spatial filter 70 and the first lens arrangement 50.

After having measured the intensity for the elements in said sub-matrix for a given voltage applied to said elements, said voltage applied to the elements in said sub-matrix is changed and the procedure is repeated for a number of different voltages. For example may the intensity from a maximum value to a minimum value be divided into 65 values. After having applied all different voltages to the sub-matrix of elements the procedure may be repeated for all sub-matricies 200 in order to cover said part of the SLM onto which the beam of electromagnetic radiation is projected. The sub-matrix may or may not change pattern from one position to another in said 2-dimensional array of elements. Instead of first repeatedly changing the control signals for a particular sub-matrix and doing so for one sub-matrix after another, one may alternatively first go through all sub-matrices for a given control signal value, and repeat that for all control signals, i.e., the order illustrated in FIG. 7 for control signals/voltages and matrices may be exchanged.

The beam of radiation is projected on to the other parts of the SLM in order to calibrate all elements in said SLM. Preferably the same size of the beam is used but the size may change with the result of covering different sizes of the parts of the SLM.

The element correction data is generated either by storing every intensity value for a given control signal, which in this case is a potential difference between the mirror and the address/control electrode, for every element in a data base or more preferably by transforming the measured intensity as a function of applied voltage onto said element as a transfer function. Said transfer function is preferably a given formula e.g. $C1+XC2+C3T3(X)+C4T4(X)$ equal for every element. The procedure for computing the constants $C1$, $C2$, $C3$ and $C4$ may be similar to what is described in connection with the previous embodiment. The procedure for finding the base functions may also be similar to what is described in connection with the previous embodiment. For example $C1+xC2$ is the formula of the straight line $T3(x)$ and $T4(x)$ may in this case two tabulated functions. $T3$ and $T4$ can be chosen so that the formula gives an adequate description of all elements.

FIG. 4b shows schematically a flow chart of another embodiment of the method according to the invention for calibrating elements in a spatial light modulator (SLM).

Figure 6:
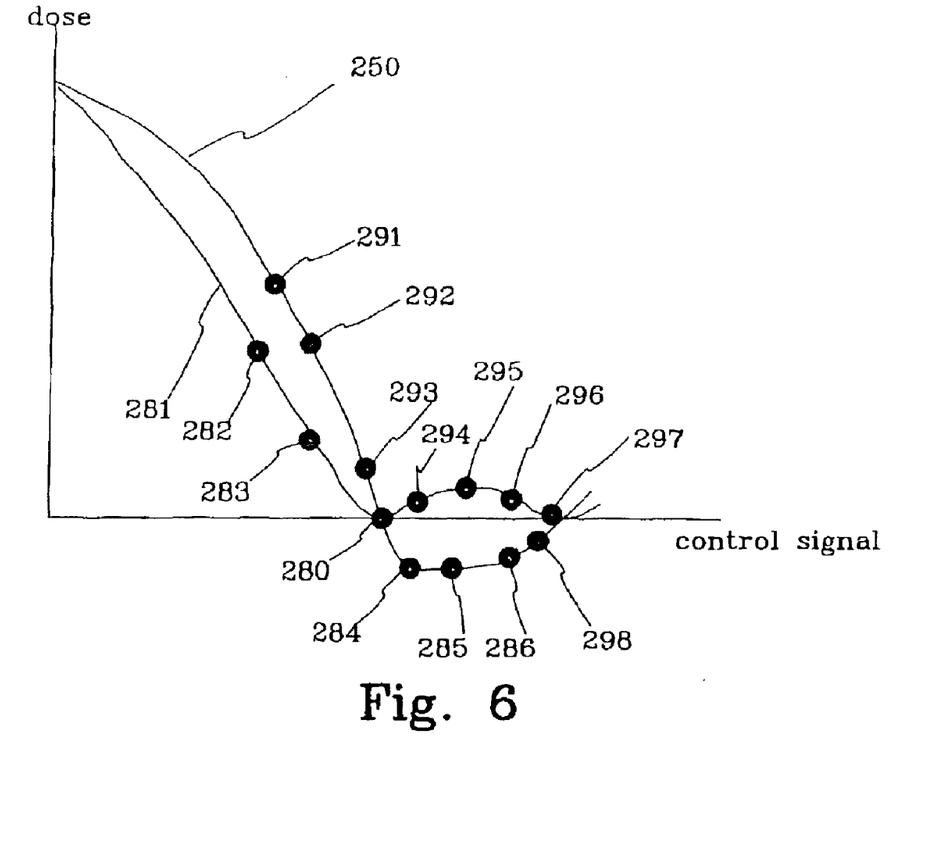
FIG. 6 shows the relationship between the control signal applied to an element of an SLM and the resulting energy and electromagnetic field amplitude.

In FIG. 6 it is shown a typical example of a relation between measured intensity on the detector arrangement and applied element control signal for an element in a SLM, this is illustrated by curve 275. In the same FIG. 6 a curve 260 represents an amplitude of the electromagnetic field as a function of applied element control signal. The relation between the intensity curve 275 and the amplitude curve 260 is that the intensity curve 275 is the square of the amplitude curve 260.

The intensity curve can for example be approximated with a $(\sin x/x)^2$ function and the amplitude curve would then be a $\sin x/x$ function.

Another way of determining an optimal zero intensity for a single element, is to use the above mentioned fact that the intensity curve can be approximated with a $(\sin x/x)^2$ function. If the local maximum at 275 is measured, the local minimum points can readily computed from said function. The local maximum is easier to measure than the factual minimum point, due to the fact that the signal in the CCD-camera at the minimum point may be obscured by the noise that is always present. However, this is not the case for the local maximum at this particular point of the intensity curve.

It has been found that the point 295 (FIG. 6) is a more stable background than 260. In a preferred embodiment, the point 295 is used instead of 260 as the control for the non-addressed elements. Both 295 and 260 can be determined by measurement of the points 291, 292, 293, 294, 296, 297 and fitting of the mathematical function $a(\sin bx/bx)^2+c$ to the points. C is a constant background intensity that can come from, for example, stray light in the measurement system. A and b are fitting constants. Alternatively, the points 281, 282, 283, 284, 286, 287 are computed from 291, 292, 293, 294, 296, 297, and fitted to the function $a'(\sin b'x/b'x)^2+c'$, where a', b', and c' are fitting constants. After one of the functions is fitted around 260 or 295, the exact location of said points may be computed from said fitted functions.

While the preceding examples are cast in terms of a method, devices and systems employing this method are easily understood. A magnetic memory containing a program capable of practicing the claimed method is one such device. A computer system having memory loaded with a program practicing the claimed method is another such device.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. A method for calibrating elements in a spatial light modulator (SLM) as a function of a control signal, including:
   projecting electromagnetic radiation onto elements in at least a part of the SLM;
   relaying at least part of said electromagnetic radiation through a spatial filter in a Fourier plane onto a detector arrangement that measures doses of the electromagnetic radiation;
   varying at least two of the elements that are non-adjacent through a first multi-valued sequence of analog control signals while measuring the doses that result; and
   computing element response curves from the measured doses.

2. The method according to claim 1, further including:
   repeatedly,
      based on the element response curves, determining an average minimum measured intensity of the elements;
      setting the elements to the average minimum measured intensity;
      varying the at least two elements that are non-adjacent through a further sequence of control signals while further measuring the doses that result; and
      computing refined element response curves from the further measured doses; and
   terminating the repetition when the average minimum measured intensity has converged according to a predetermined criteria.

3. The method according to claim 1, further including:
   repeatedly,
      based on the element response curves, determining an upper bound on respective minimum measured doses of the elements;
      setting the elements to the upper bound;
      varying the at least two elements that are non-adjacent through a further sequence of control signals while further measuring the doses that result;
      computing refined element response curves from the further measured doses; and
   terminating the repetition when the upper bound on the respective minimum measured doses has converged according to a predetermined criteria.

4. The method of claim 1, further comprising repeating the steps of claim 1 for additional sets of at least two elements that are non-adjacent for substantially all of the elements in the section of the SLM.

5. The method of claim 2, further comprising repeating the steps of claim 1 for additional sets of at least two elements that are non-adjacent for substantially all of the elements in the section of the SLM.

6. The method of claim 3, further comprising repeating the steps of claim 1 for additional sets of at least two elements that are non-adjacent for substantially all of the elements in the section of the SLM.

7. The method according to claim 1, further including mapping the elements in the SLM to elements in the detector arrangement.

8. The method according to claim 2, further including computing refined element response curves for one or more remaining parts of the SLM.

9. The method according to claim 3, further including computing refined element response curves for one or more remaining parts of the SLM.

10. The method according to claim 1, wherein the at least two non-adjacent elements are separated sufficiently that the measured doses corresponding to one of the at least two non-adjacent elements are essentially independent of the measured doses corresponding to any other of the at least two non-adjacent elements.

11. The method according to claim 1, wherein the at least two non-adjacent elements are separated sufficiently that relayed electromagnetic radiation from one of the at least two non-adjacent elements is substantially non-overlapping with relayed electromagnetic radiation from any other of the at least two non-adjacent elements.

12. The method according to claim 1, wherein said detector arrangement is a CCD-camera.

13. The method according to claim 1, wherein said electromagnetic radiation is a pulsed laser.

14. The method according to claim 13, wherein the computing step further includes:
integrating the measured doses resulting from a plurality of laser pulses.

15. The method according to claim 13, further including correcting for pulse energy variations.

16. The method according to claim 14, further including correcting for pulse energy variations.

17. The method according to claim 11, further including repeating said method for additional sets of at least two elements, wherein the sequences of control signals and patterns formed by the at least two elements may vary among the sets.

18. The method according to claim 2, further including deriving functional approximations for the refined element response curves.

19. The method according to claim 3, further including deriving functional approximations for the refined element response curves.

20. The method according to claim 18, wherein said functional approximations are stored in a look up table.

21. An apparatus for patterning a work piece arranged at an image plane and sensitive to electromagnetic radiation, comprising:
a source emitting electromagnetic radiation onto an object plane;
a computer-controlled spatial light modulator (SLM) comprising a plurality of elements, adapted to receive said electromagnetic radiation at said object plane and to relay said electromagnetic radiation toward said work piece; and
an optical projection system comprising a Fourier filter adapted to filter said relayed electromagnetic radiation in a Fourier space and at least one lens arrangement; and
logic operable on the computer-controlled SLM to calibrate the elements according to the method of claim 1.

22. A method for calibrating multi-value elements in a Spatial Light Modulator (SLM), including:
mapping elements of an SLM to corresponding elements of a detector arrangement;
repeatedly,
setting multi-value control signals for a set of the SLM elements to produce a target dose;
relaying electromagnetic radiation from the set of SLM elements through a spatial filter in a Fourier plane onto a detector arrangement to measure doses of the electromagnetic radiation;
adjusting the multi-value control signals for the set of the SLM elements corresponding to an individuated difference between the measured doses and the target dose at the detector arrangement; and
terminating the repetition when the difference between the measured dose and the target dose satisfies a predetermined criteria.

23. The method of claim 22, wherein the repeating of steps is carried out for at least three target intensity values.

24. The method of claim 23, wherein at least two of the target intensity values are selected to set a dynamic range of measured doses of the elements.

25. The method of claim 22, further comprising computing element calibration data from the modified control signals and target intensity values.

26. The method according to claim 22, further comprising the action of:
further including repeating said method for additional sections of the SLM.

27. The method according to claim 22, further including mapping the elements in the SLM in relation to elements in the detector arrangement.

28. The method according to claim 22, wherein said detector arrangement is a CCD-camera.

29. The method according to claim 22, wherein said electromagnetic radiation is a pulsed laser.

30. The method according to claim 23, wherein said measured values are stored in a look up table.

31. The method according to claim 22, further including further including repeating said method for additional sections of the SLM.

32. The method according to claim 22, further including mapping the elements in the SLM in relation to elements in the detector arrangement.

33. The method according to claim 22, wherein said detector arrangement is a CCD-camera.

34. An apparatus for patterning a work piece arranged at an image plane and sensitive to electromagnetic radiation, comprising:
a source emitting electromagnetic radiation onto an object plane;
a computer-controlled spatial light modulator (SLM) comprising a plurality of elements, adapted to receive said electromagnetic radiation at said object plane and to relay said electromagnetic radiation toward said work piece; and
an optical projection system comprising a Fourier filter adapted to filter said relayed electromagnetic radiation in a Fourier space and at least one lens arrangement; and
logic operable on the computer-controlled SLM to calibrate the elements according to the method of claim 22.

35. A method for calibrating phase-modulated elements in a Spatial Light Modulator (SLM), including:
mapping the elements of the SLM to corresponding elements of a detector arrangement;
repeatedly,
setting phase-modulation control signals for a set of the SLM elements to produce a target dose;
relaying electromagnetic radiation from the set of the SLM elements through a filter that transforms phase-modulated radiation into amplitude-modulated radiation and onto a detector arrangement to measure doses of the electromagnetic radiation;
adjusting the phase-modulation control signals for the set of the SLM elements corresponding to an individuated difference between the measured doses and the target dose at the detector arrangement; and
terminating the repetition when the difference between the measured dose and the target dose satisfies a predetermined criteria.

36. The method of claim 35, wherein the repeating of steps is carried out for at least three target intensity values.

37. The method of claim 36, wherein at least two of the target intensity values are selected to set a dynamic range of measured doses of the elements.

38. The method of claim 36, further comprising computing element calibration data from the modified control signals and target intensity values.

39. The method according to claim 38, wherein said element calibrating data are a number of constants in a predetermined formula.

40. The method according to claim 35, wherein said electromagnetic radiation is a pulsed laser.

41. The method according to claim 38, wherein said element calibrating data are a number of constants in a predetermined formula.

42. The method according to claim 35, wherein said measured values are stored in a look up table.

* * * * *